United States Patent [19]

Huang

[11] Patent Number: 5,437,763
[45] Date of Patent: Aug. 1, 1995

[54] METHOD FOR FORMATION OF CONTACT VIAS IN INTEGRATED CIRCUITS

[75] Inventor: Kuei-Wu Huang, Irving, Tex.

[73] Assignee: SGS-Thomson Microelectronics, Inc., Carrollton, Tex.

[21] Appl. No.: 319,234

[22] Filed: Oct. 6, 1994

Related U.S. Application Data

[62] Division of Ser. No. 843,507, Feb. 28, 1992, Pat. No. 5,384,483.

[51] Int. Cl.$^6$ .................. B44C 1/22; C03C 15/00; C23F 1/02
[52] U.S. Cl. .................. 216/18; 437/189; 437/194; 216/38; 216/48; 216/47; 216/80
[58] Field of Search ............ 156/643, 644, 653, 656, 156/657, 659.1, 661.1, 662, 663; 437/189, 194; 257/644, 647

[56] References Cited

U.S. PATENT DOCUMENTS

| | | | |
|---|---|---|---|
| 3,383,568 | 5/1968 | Cunningham | 257/644 |
| 4,123,565 | 10/1978 | Sumitomo et al. | 257/644 |
| 4,489,481 | 12/1984 | Jones | 257/750 |
| 4,614,021 | 9/1986 | Hulseweh | 437/189 |
| 4,615,984 | 6/1987 | Hsu | 257/647 |
| 4,946,550 | 8/1990 | Van Laarhoven | 156/644 |
| 5,272,115 | 12/1993 | Sato | 156/644 |

FOREIGN PATENT DOCUMENTS 901350 6/1985 Belgium .
0388862A2 9/1990 European Pat. Off. .
0488546A1 3/1992 European Pat. Off. .

Primary Examiner—William Powell
Attorney, Agent, or Firm—Kenneth C. Hill; Lisa K. Jorgenson; Richard K. Robinson

[57] ABSTRACT

A method for forming contact vias in a integrated circuit which do not have planarizing material nearby. After a first insulating layer is deposited over the integrated circuit, a planarizing layer is deposited over the first insulating layer. The planarizing layer is etched back and portions of the planarizing layer may remain in the lower topographical regions of the first insulating layer to planarize the surface of the integrated circuit. A first masking layer is then formed over the surface of the integrated circuit. The openings created in the first masking layer have a size which is greater than the size of the contact vias to be formed. The first insulating layer is partially etched into so that portions of the planarizing layer near the locations of the contact vias are removed. The first masking layer is then removed, and a second insulating layer is deposited over the integrated circuit. A second masking layer having openings which define the locations of the contact vias to be created is then formed over the second insulating layer. The size of the openings in the second masking layer are smaller than the size of the openings in the first masking layer. The contact vias are then formed through the first and second insulating layers.

21 Claims, 2 Drawing Sheets

METHOD FOR FORMATION OF CONTACT VIAS IN INTEGRATED CIRCUITS

This is a division, of application Ser. No. 07/843,507, filed Feb. 28, 1992, now U.S. Pat. No. 5,384,483.

BACKGROUND OF THE INVENTION

1. Field of the Invention

The present invention relates generally to the fabrication of integrated circuits, and more particularly to a method for forming contact vias in integrated circuits.

2. Description of the Prior Art

By increasing the density of components in an integrated circuit, it has become necessary to fabricate multilevel metal interconnect and contacts between the layers. To maintain the integrity of the layers of metal interconnect and contacts, insulating layers must be formed between each metal interconnect layer. Fabricating multiple layers, however, results in the creation of hills and valleys on the surface of the device. Those skilled in the art will recognize it is difficult to get upper interconnect layers to maintain constant cross sections when crossing over uneven topography. This can lead to portions of the metal interconnect lines having a higher current density or voids in the lines themselves. These defects can cause electromigration or other related device failure mechanisms.

Various techniques are used during the fabrication process to planarize the surface of the integrated circuit. One method involves depositing a layer of spin on glass over an insulating layer. The spin on glass is then etched back so that portions of the spin on glass remain in the lower topographical regions of the insulating layer. This planarizes the surface of the integrated circuit. A problem arises, however when forming contact vias between metal interconnect lines. When forming a metal contact within the contact via, the spin on glass can contaminate the metal contact. This can cause step coverage problems or increased resistivity in the contact.

Therefore, it would be desirable to provide a method for fabricating contact vias in integrated circuits which do not have planarizing material therein. It is also desirable that such a method not significantly increase the complexity of the manufacturing process.

SUMMARY OF THE INVENTION

According to the present invention, a method is provided for forming contact vias in integrated circuits which do not have planarizing material therein. After a first insulating layer is deposited over the integrated circuit, a planarizing layer is deposited over the first insulating layer. The planarizing layer is etched back and portions of the planarizing layer may remain in the lower topographical regions of the first insulating layer to planarize the surface of the integrated circuit. A first masking layer is then formed over the surface of the integrated circuit. The openings created in the first masking layer have a size which is greater than the size of the contact vias to be formed. The first insulating layer is partially etched into so that portions of the planarizing layer near the locations of the contact vias are removed. The first masking layer is then removed, and a second insulating layer is deposited over the integrated circuit. A second masking layer having openings which define the locations of the contact vias to be created is then formed over the second insulating layer. The size of the openings in the second masking layer are smaller than the size of the openings in the first masking layer. The contact vias are then formed through the first and second insulating layers.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
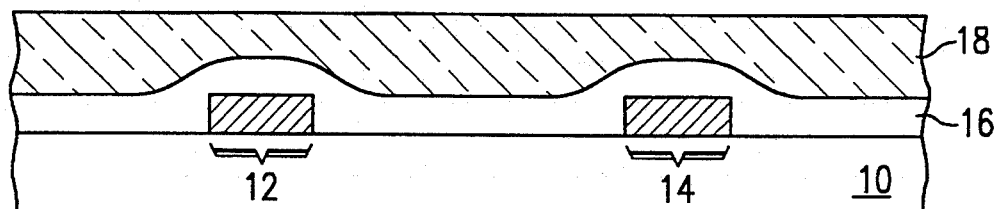
FIGS. 1-8 are sectional views of an integrated circuit illustrating a preferred method for forming contact vias in an integrated circuit according to the present invention.

Referring to FIG. 1, conductive elements 12, 14 are formed on an underlying region 10 in an integrated circuit. The underlying region 10 can be either a semiconductor substrate or an interlevel insulating layer. The conductive elements are preferably metal interconnect signal lines, but can also be polycrystalline silicon interconnect signal lines. A first insulating layer 16 is then deposited over the integrated circuit, followed by a planarizing layer 18. The first insulating layer 16 is preferably made of oxide, and the planarizing layer 18 is preferably made of spin on glass. Other insulating and planarizing materials, however, can be used.

Figure 2:
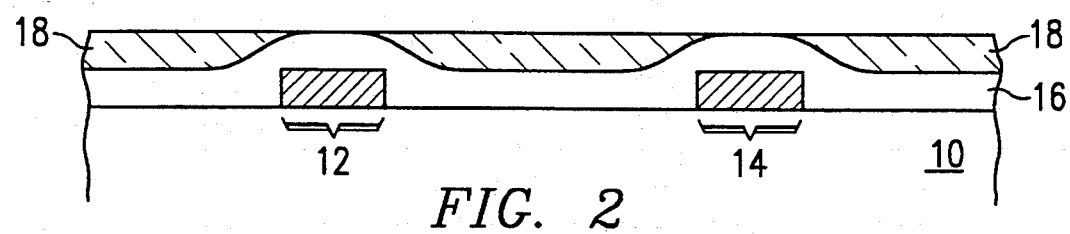

FIG. 2 illustrates the integrated circuit after an anisotropic etch is performed leaving portions of the planarizing layer 18 in the lower topographical regions of the first insulating layer 16. As known in the art, this planarizes the surface of the integrated circuit.

Figure 3:
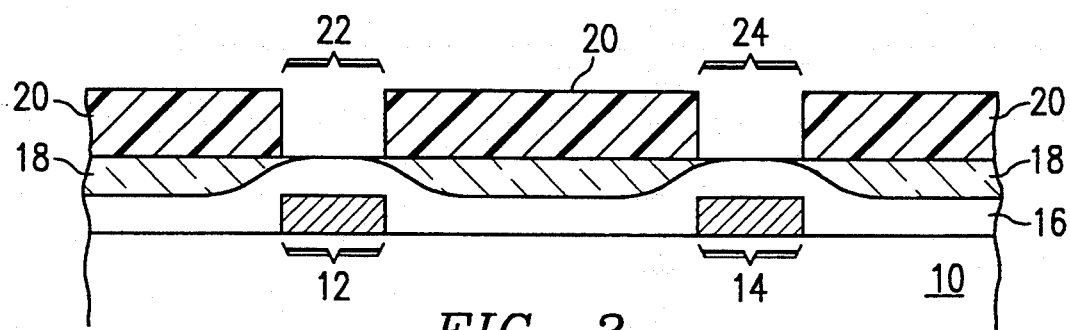

Referring to FIG. 3, a first masking layer 20 is deposited and patterned on the surface of the integrated circuit using techniques known in the art. The first masking layer 20 is typically a photoresist mask. Openings 22, 24 in the first masking layer 20 are made larger than the contact vias to be formed later.

Figure 4:
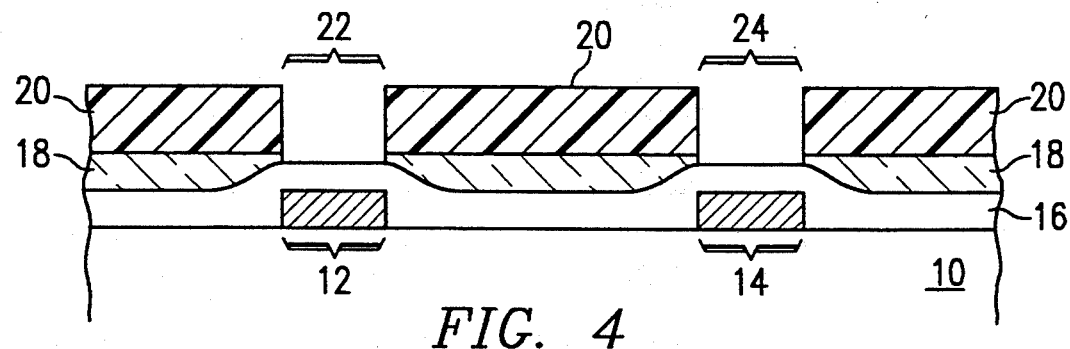

The purpose for making the size of the openings 22, 24 in the masking layer 20 larger is illustrated in FIG. 4. Those portions of the first insulating layer 16 which are exposed in the openings 22, 24 are anisotropically etched partway through. Portions of the planarizing layer 18 which are located near the contact vias to be formed are also removed. This is done so that when the contact vias are formed, there will not be any planarizing material nearby to contaminate the contacts.

Figure 5:
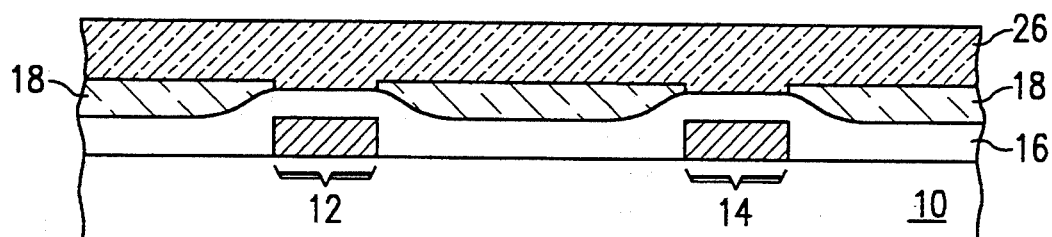

Referring to FIG. 5, the first masking layer 20 is removed and a second insulating layer 26 is deposited over the integrated circuit. The second insulating layer 26 is preferably made of oxide, but can be made of other insulating materials.

Figure 6:
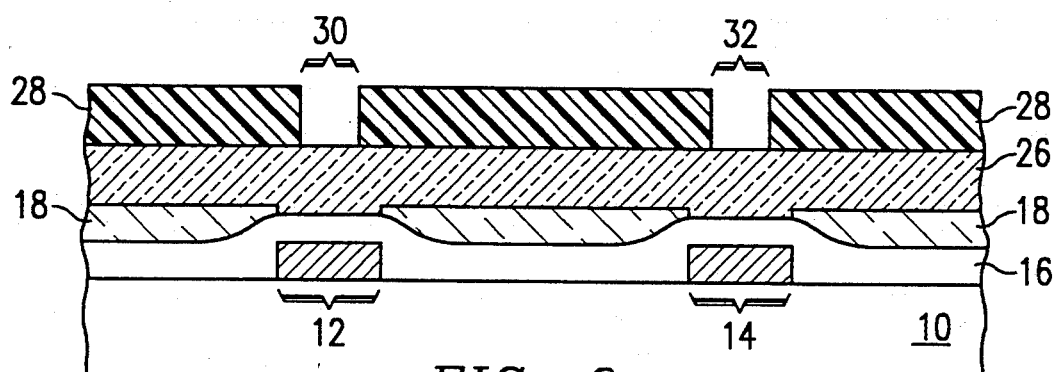

FIG. 6 illustrates the integrated circuit after a second masking layer 28 is deposited over the second insulating layer 26. The masking layer 28 is patterned using techniques known in the art to form openings 30, 32 which define the locations of the contact vias to be formed. The masking layer 28 typically is a photoresist mask. The sizes of the openings 30, 32 are smaller than the openings 22, 24 made in the first masking layer 20.

Figure 7:
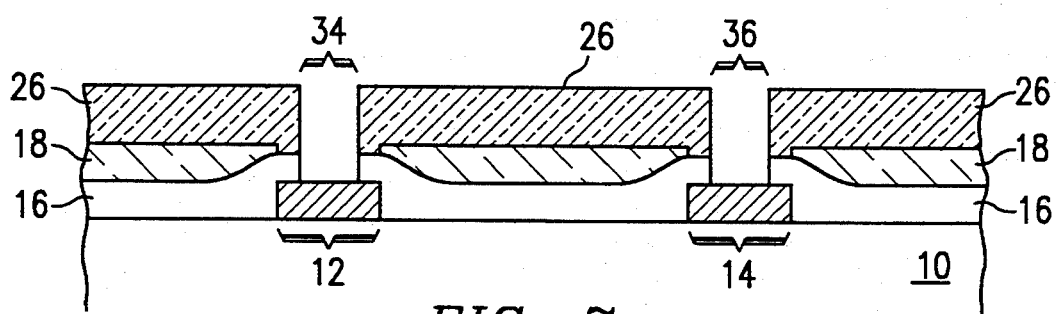

Referring to FIG. 7, contact vias 34, 36 are formed by performing an anisotropic etch through the first 16 and second 26 insulating layers to expose the conductive elements 12, 14. The second masking layer 28 is then removed.

As can be seen, the planarizing material in the planarizing layer 18 is not exposed in the contact vias 34, 36. The contact vias 34, 36 are surrounded by the materials in the first 16 and second 26 insulating layers. Those skilled in the art will recognize that this prevents the planarizing material from migrating into the contact vias 34, 36 and contaminating the metal used for the contacts or causing step coverage problems later on in the fabrication process.

Figure 8:
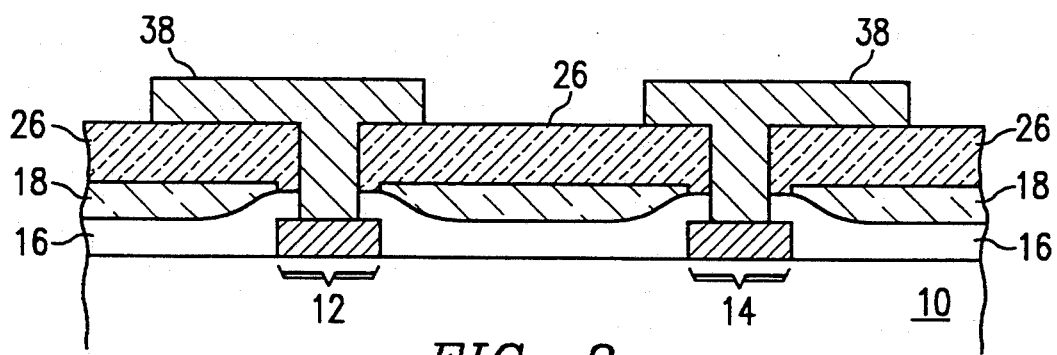

Referring to FIG. 8, a conductive layer 38 is deposited and patterned over portions of the second insulating layer 26 and extends into the contact vias 34, 36 to make electrical contact with the conductive elements 12, 14. The conductive layer 38 is preferably made of aluminum, but other conducting materials can be used. The integrated circuit is now ready for further processing steps.

As described above, the present invention provides a method for forming contact vias which are free from highly doped planarizing materials along the sidewalls. This prevents the planarizing material from outgassing or contaminating the contacts or causing step coverage problems later on in the fabrication process. Furthermore, the present invention does not significantly increase the complexity of the fabrication process.

While the invention has been particularly shown and described with reference to a preferred embodiment, it will be understood by those skilled in the art that various changes in form and detail may be made therein without departing from the spirit and scope of the invention.

I claim:

1. A method for forming contact vias in an integrated circuit, comprising the steps of:
    forming a first insulating layer containing planarizing material on the upper surface thereof over an underlying region in the integrated circuit;
    partially etching into the first insulating layer at the locations of the contact vias to be formed, wherein the first insulating layer is etched deep enough to remove the planarizing material;
    forming a second insulating layer over the integrated circuit; and
    forming the contact vias through the first and second insulating layers to expose a portion of the underlying region.

2. The method of claim 1, further comprising the steps of depositing and patterning a conductive layer over portions of the second insulating layer, wherein the conductive layer extends into the contact vias to make electrical contact with a portion of the underlying region.

3. The method of claim 1, wherein said step of forming the first insulating layer containing planarizing material comprises the steps of:
    depositing a layer of oxide over the integrated circuit;
    depositing a layer of spin on glass over the layer of oxide; and
    anisotropically etching the spin on glass.

4. The method of claim 1, wherein said step of partially etching into the first insulating layer comprises anisotropically etching the layer.

5. The method of claim 1, wherein said step of forming a second insulating layer comprises depositing a layer of oxide over the integrated circuit.

6. The method of claim 1, wherein said step of forming the contact vias comprises anisotropically etching through the first and second insulating layers.

7. The method of claim 1, wherein said underlying region comprises an interconnect layer formed on a semiconductor substrate.

8. The method of claim 7, wherein said interconnect layer comprises a metal interconnect.

9. A method for forming contact vias in an integrated circuit, comprising the steps of:
    forming conductive elements of an underlying region in the integrated circuit;
    forming a first insulating layer over the integrated circuit;
    forming a planarizing layer over the first insulating layer;
    forming a first masking layer over the integrated circuit;
    patterning the first masking layer to define openings, wherein the size of the openings are larger than the size of the contact vias to be formed;
    removing a portion of the first insulating layer and any remaining portions of the planarizing layer within the opening;
    removing the first masking layer;
    forming a second insulating layer over the integrated circuit;
    forming a second masking layer over the second insulating layer;
    patterning the second masking layer to form openings which define the locations of the contact vias to be formed, wherein the size of openings in the second masking layer are smaller than the size of the openings made in the first masking layer; and
    forming the contact vias through the first and second insulating layers to expose a portion of the conductive elements.

10. The method of claim 9, wherein said step of forming conductive elements on the underlying region comprises depositing a layer of metal and patterning it to define metal interconnect.

11. The method of claim 10, wherein said underlying region comprises a semiconductor substrate.

12. The method of claim 9, wherein said step of forming the first insulating layer comprises depositing a layer of oxide over the integrated circuit.

13. The method of claim 9, wherein said step of forming the planarizing layer comprises depositing a layer of spin on glass over the dielectric layer.

14. The method of claim 9, wherein prior to forming the first masking layer the planarizing layer is etched in order to make the planarizing layer thinner.

15. The method of claim 14, wherein the planarizing layer is anisotropically etched.

16. The method of claim 9, wherein said step of forming a first masking layer comprises depositing a photoresist layer over the integrated circuit.

17. The method of claim 9, wherein said step of removing a portion of the first insulating layer and any remaining portions of the planarizing layer comprises anisotropically etching said layers.

18. The method of claim 9, wherein said step of forming the second insulating layer comprises depositing a layer of oxide over the integrated circuit.

19. The method of claim 9, wherein said step of forming a second masking layer comprises depositing a photoresist layer over the insulating layer.

20. The method of claim 9, wherein said step of forming the contact vias comprises anisotropically etching the contact vias to expose a portion of the conductive elements.

21. The method of claim 9, further comprising the steps of:
    removing the second masking layer; and
    depositing and patterning a conductive layer over a portion of the insulating layer, wherein the conductive layer extends into the contact vias conductive layer electrical contact with the conductive elements.

* * * * *